United States Patent [19]

Kunishima et al.

[11] Patent Number: 5,211,987
[45] Date of Patent: May 18, 1993

[54] METHOD AND APPARATUS FOR FORMING REFRACTORY METAL FILMS

[75] Inventors: Iwao Kunishima, Tokyo; Hitoshi Itoh, Mitaka, both of Japan

[73] Assignee: Kabushiki Kaisha Toshiba, Kawasaki, Japan

[21] Appl. No.: 800,743

[22] Filed: Nov. 29, 1991

Related U.S. Application Data

[63] Continuation of Ser. No. 215,770, Jul. 6, 1988, abandoned.

[30] Foreign Application Priority Data

Jul. 10, 1987 [JP] Japan .................. 62-171219

[51] Int. Cl.$^5$ .................. C23C 16/06; C23C 16/56
[52] U.S. Cl. .................. 427/250; 427/255; 427/255.1; 427/383.1; 427/124; 427/99
[58] Field of Search .......... 427/250, 99, 331, 383.1, 427/255, 255.1, 124; 437/200, 192

[56] References Cited

U.S. PATENT DOCUMENTS

| | | | |
|---|---|---|---|
| 4,619,840 | 10/1986 | Goldman et al. | 427/91 |
| 4,794,019 | 12/1988 | Miller | 427/124 |
| 4,988,670 | 1/1991 | Itozaki et al. | 505/1 |

FOREIGN PATENT DOCUMENTS

| | | | |
|---|---|---|---|
| 58-98921 | 6/1983 | Japan | 437/200 |
| 58-200530 | 11/1983 | Japan | 437/200 |

OTHER PUBLICATIONS

Ohba et al., "Selective CVD Tungsten Silicide for VLSI Applications," IEDM 1987, Extended Abstract pp. 213–216.

Kotani et al., "A Highly Reliable Selective CVD-W Utilizing SiH$_4$ Reduction for VLSI Contacts," IEDM 1987, Extended Abstract, pp. 217–220.

Green et al., "Structure of Selective Low Pressure Chemically Vapor-Deposited Films of Tungsten," J. Electrochem. Soc., vol., 132, No. 5, 1985, pp. 1243–1250.

Michael Diem, Michael Fisk and Jon Goldman, "Properties of Chemically Vapor-Deposited Tungsten Thin Films on Silicon Wafers", *Thin Solid Films*, 107 (1983) 39–43, Electronics and Optics.

Primary Examiner—Shrive Beck
Assistant Examiner—Roy V. King
Attorney, Agent, or Firm—Foley & Lardner

[57] ABSTRACT

A method for improving the adhesion between a refractory metal film and a silicon substrate is disclosed, which comprises depositing the refractory metal film on the silicon substrate at a first temperature; and heating the contact surface between the deposited film and the silicon surface at a second temperature between 300° and 600° C., wherein the depositing and heating steps are performed in a single reaction furnace and the temperature between the depositing and heating steps does not drop below about 300° C.

22 Claims, 5 Drawing Sheets

METHOD AND APPARATUS FOR FORMING REFRACTORY METAL FILMS

This application is a continuation of application Ser. No. 07/215,770, filed Jul. 6, 1988, now abandoned.

BACKGROUND OF THE INVENTION

1. Field of the Invention

The present invention relates to a method and apparatus for forming refractory metal films at contacts of a substrate, and particularly to a method and apparatus for forming refractory metal films that do not easily separate from a substrate on which the films are formed.

2. Description of the Prior Art

FIGS. 1a to 1c are views showing a prior art method for forming contacts on a semiconductor substrate between an impurity diffusion layer and electrode wiring of the substrate.

As shown in FIG. 1a, a semiconductor substrate 1 is provided with element separation regions 2. A silicon oxide film 3 of about 0.8 μm in thickness is formed on the substrate 1 by using a vapor deposition technique. A numeral 4 represents a diffusion layer formed by using an ion implantation technique and having conduction type opposite to that of the substrate 1.

As shown in FIG. 1b, a contact hole 5 is opened at a required position of the silicon oxide film 3 according to a known process such as a photoetching process and a reactive ion etching process to provide an access to the diffusion layer 4. Then, as shown in FIG. 1c, a wiring metal film 6 of about 0.8 μm in thickness made of, for example, Al/Si alloy is formed by using a spattering technique, etc. The wiring metal film 6 is patterned by using a known process such as the photoetching process and the reactive ion etching process to form a circuit.

The contact forming method explained in the above will hereinafter be referred to as the first contact forming method.

With improvements in the integration of circuits and the miniaturization of elements, the first contact forming method is currently having two problems.

The first problem is that substances such as Si contained in the wiring metal film 6 precipitate on the bottom of the contact hole 5. Due to the preciptitation, an effective contact area of the contact hole 5 reduces to increase contact resistance. If many substances precipitate in the contact hole 5, conduction of the contact is seriously deteriorated.

The second problem occurs in forming very fine elements. Namely, it occurs when a ratio of diameter to depth (aspect ratio) of the contact hole 5 is large. If the aspect ratio is large, or if the contact hole is very small and deep, a wiring metal film of the sputtering process is not sufficiently formed to reach the bottom of the hole. This insufficient formation of film in the contact hole is the second problem and causes low-step coverage by a shadowing effect. Due to the shadowing effect, metal particles of the wiring metal film deposit to a upper corner of the hole to block an opening of the hole. The shadowing effect may cause a disconnection failure of the contact.

These two problems may seriously reduce the reliability of semiconductor elements.

To solve the problems of the first contact forming method, a method has been proposed to use the chemical vapor deposition technique with refractory metal halides to selectively embed refractory metal films in contact holes formed on a diffusion layer or on electrodes.

For example, a mixture of refractory metal halide gas such as tungsten hexafluoride (WF$_6$) gas and silane (SiH$_4$) gas is introduced into a reactor vessel in which a substrate is positioned, to selectively embed refractory metal films, i.e., tungsten (W) films in contact holes of the substrate according to the chemical vapor deposition technique.

Namely, as shown in FIG. 2a, the same technique as that used for the first contact forming method is used to form a contact hole 5 on a semiconductor substrate 1. The substrate 1 is placed in the reactor vessel whose inside pressure is reduced. In FIGS. 2a to 2c, the same reference marks as those shown in FIGS. 1a to 1c represent like parts. A mixture of WF$_6$ gas and SiH$_4$ gas is introduced into the reactor vessel at about 400° C. to form a tungsten (W) film 9 only in the contact hole 5. After that, the sputtering technique is used to coat the substrate 1 with wiring metal film 6 of Al/Si alloy of about 0.8 μm in thickness. The wiring metal film 6 is patterned with the same technique as that of the first contact forming method to form a circuit.

This latter method is hereinafter referred to as the second contact forming method.

The second contact forming method may solve the two problems of the first contact forming method. Since the wiring 6 made of Al/Si alloy is not directly contacting with the substrate 1, silicon (Si) does not precipitate in the contact hole 5. Not like the sputtering technique, the tungsten film 9 is satisfactorily embedded on a diffusion layer 4 due to the reaction of the gases so that no stepped portions will be formed at the contact, thus preventing a disconnection failure at the contact from occurring.

However, after testing the second contact forming method several times, it has been found that adhesion between the silicon substrate 1 and the tungsten film 9 is very weak. For example, in the case of a tungsten film deposited for 1 μm or more, a separation 10 shown in FIG. 2c has been caused due to thermal and/or intrinsic stress to cause a contact fault. In the case of a tungsten film deposited for less than 1 μm, the same separation and contact failure have occurred after a thermal cycle test carried out in the temperature range of +200° C. to −100° C.

Therefore, even with the second contact forming method, it is difficult to maintain the reliability of semiconductor devices. The problems mentioned above are very serious in integrating semiconductor circuits.

In the case of forming refractory metal films not as contacts but as, for example, wiring on a substrate made of silicon, etc., the separation may occur between the wiring and the substrate when the substrate is exposed to hot water or liquid nitrogen.

As described in the above, in forming electrodes and wiring on a substrate, there is a need to solve the problem of insufficient adhesion between refractory metal films and the substrate.

SUMMARY OF THE INVENTION

An object of the present invention is to provide a method for forming refractory metal films at contacts of a substrate such that no separation occur between the films and the substrate.

Another object of the present invention is to provide a method for improving adhesion of refractory metal films to improve the reliability of contacts of a substrate.

In order to achieve the objects according to an aspect of the present invention, refractory metal films are formed on a substrate according to a chemical vapor deposition technique at a predetermined temperature and, just after the formation of the films, a heat treatment is carried out on the substrate at a temperature higher than the temperature at which the refractory metal films have been formed. Between the formation of the films and the heat treatment, no intermediate process is done at a temperature lower than the temperature at which the films have been formed.

According to this aspect of the present invention, adhesion between the substrate and the refractory metal films is improved to prevent separation of the refractory metal films from occurring, thus forming reliable contacts on the substrate.

According to another aspect of the present invention, there is provided an apparatus for forming refractory metal films on a substrate. The apparatus comprises a reactor vessel, a first heater and a second heater. The first heater generates a first predetermined temperature at which the refractory metal films are formed on the substrate in the reactor vessel according to the chemical vapor deposition technique. The second heater is operated during the continuous operation of the first heater and generates a second predetermined temperature which is higher than the first predetermined temperature and at which a heat treatment is carried out on the substrate and refractory metal films. Between the formation of the films and the heat treatment, no intermediate process is done at a temperature lower than the first predetermined temperature.

These and other objects, features and advantages of the present invention will become apparent from the following descriptions of preferred embodiments taken in conjunction with the accompanying drawings.

DETAILED DESCRIPTION OF THE PREFERRED EMBODIMENTS

FIGS. 3a to 3d are cross-sectional views showing manufacturing processes according to the method of the present invention for forming refractory metal films on a substrate.

Figure 1A:
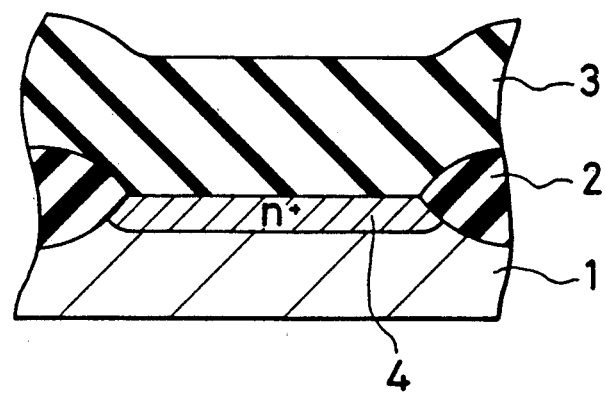
FIGS. 1a, 1b, and 1c and 2a, 2b and 2c are cross-sectional views showing prior art manufacturing processes for forming contacts on a substrate.
Figure 1B:
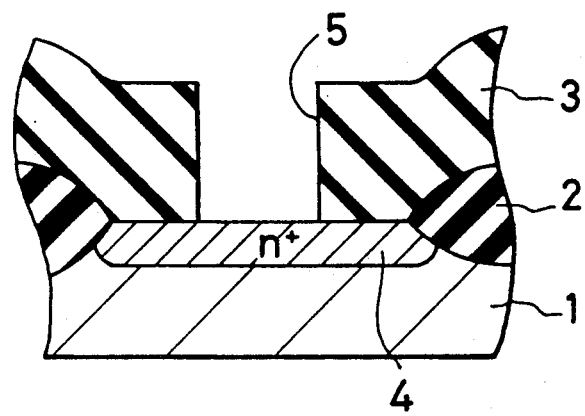
Figure 1C:
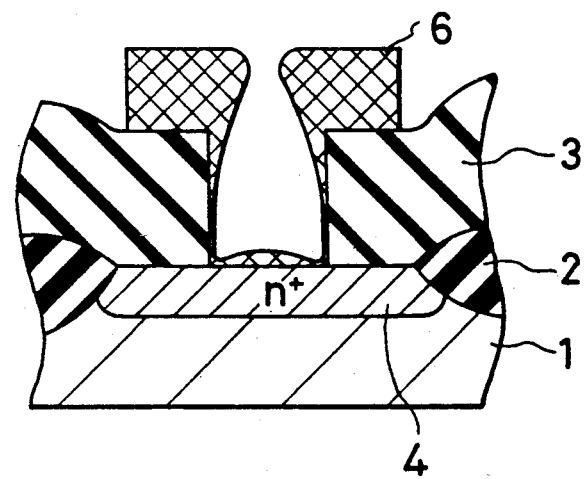
Figure 2A:
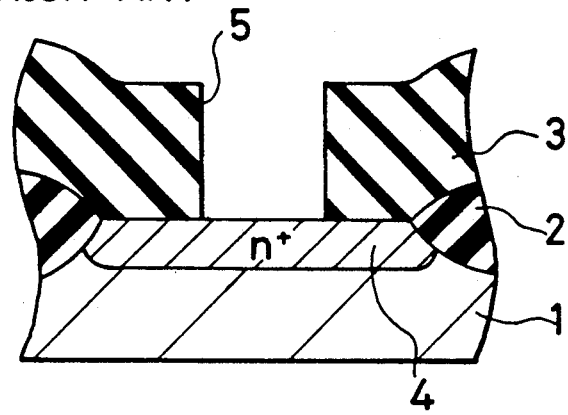
Figure 2B:
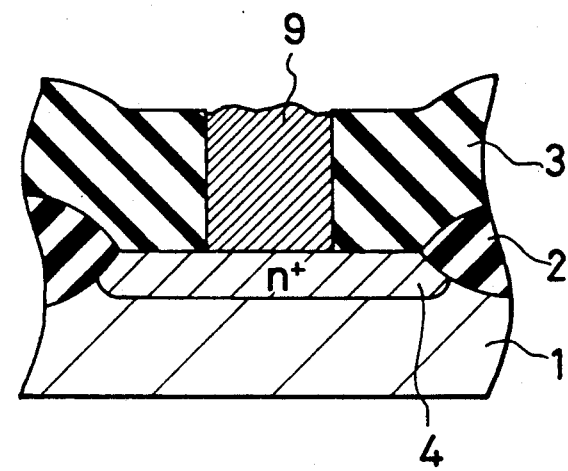
Figure 2C:
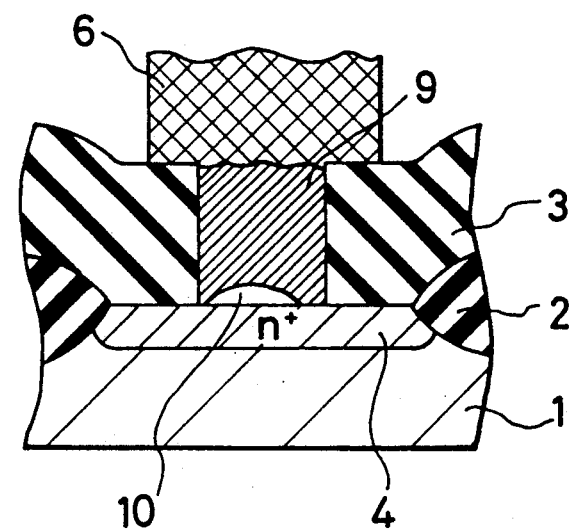
Figure 3A:
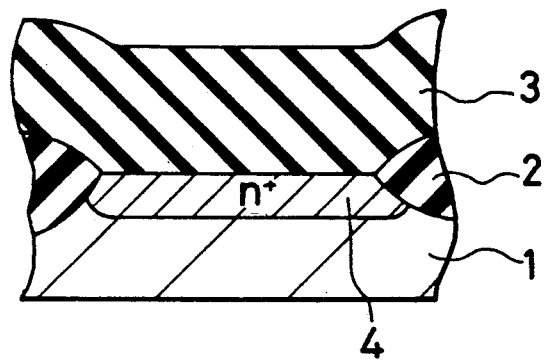
FIGS. 3a, 3b, 3c and 3d are cross-sectional views showing manufacturing processes of a refractory metal film according to an embodiment of the present invention.
Figure 3B:
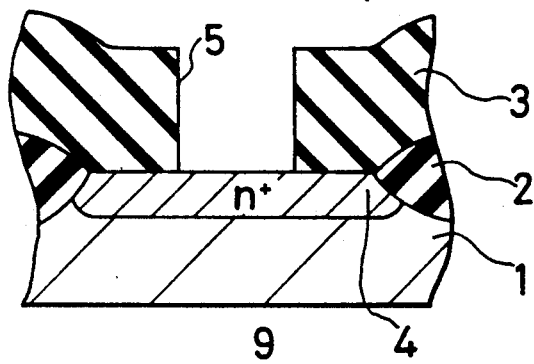
Figure 3C:
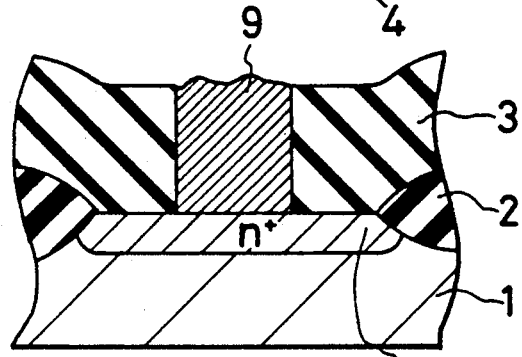
Figure 3D:
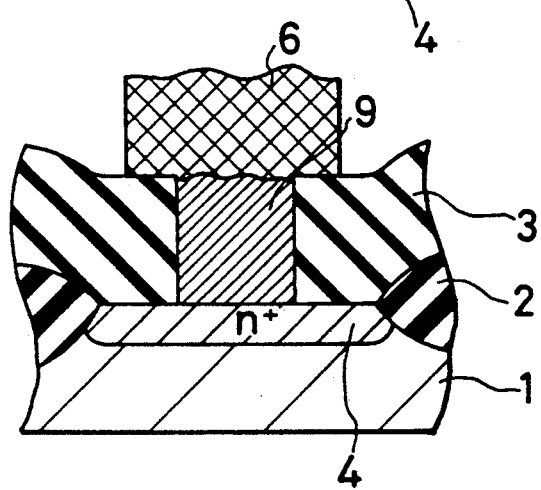

As shown in FIG. 3a, a P-type silicon (Si) substrate 1 has element separation regions 2. Ions such as As ions are implanted to the substrate 1 to form an $n^+$ type diffusion layer 4. After that, a silicon dioxide ($SiO_2$) film 3 is formed as an insulation film over the substrate 1 according to a chemical vapor deposition (CVD) technique. The $SiO_2$ film 3 is etched as shown in FIG. 3b according to a known photoetching process to form a contact hole 5 through which an electrode is connected to the $n^+$ type diffusion layer 4.

After that, the substrate 1 is placed in a reactor furnace into which a mixture of $WF_6$ gas, $H_2$ gas and $SiH_4$ gas is introduced. Then, a tungsten (W) film 9 deposits on the diffusion layer 4 in the contact hole 5 according to a selective chemical vapor deposition technique. The tungsten film 9 will grow to the thickness of about 1 $\mu$m and fill the contact hole 5 satisfactorily.

This selective chemical vapor deposition is carried out while the temperature of the substrate 1 is 300° C., the inner pressure of the reactor furnace is 0.01 to 5 Torr, and the mol ratio of $WF_6/H_2/SiH_4$ is 1/10/1. After the mixture of $WF_6$ gas, $H_2$ gas and $SiH_4$ gas is stopped, the semiconductor substrate 1 and metal film 9 are continuously subjected to a known lamp annealing process in the reactor furnace with the surface temperatures of the substrate 1 and metal film 9 still at 300° C. According to the lamp annealing process, the substrate 1 and metal film 9 are heated to 500° C. and treated for 180 seconds in an atmosphere of nitrogen ($N_2$) gas.

After the heat treatment, a film of Al/Si is deposited and patterned to form a wiring 6.

According to this embodiment, the tungsten (W) film 9 is formed to fill the contact hole 5. Then, without decreasing the temperature of the substrate below the temperature at which the tungsten film 9 has been formed, the heat treatment is carried out to the substrate 1 and tungsten film 9 at a temperature higher than the temperature at which the tungsten film 9 has been formed. As a result, the tungsten film 9 and substrate 1 sufficiently adhere to each other to prevent the tungsten film from separating from the substrate.

According to a thermal cycle test carried out on contact holes each of 2 $\mu$m in diameter, a percent failure of the prior art example has been 75%, while that of the embodiment of the present invention 0%. Thus, it has been proved that the embodiment of the present invention can perfectly prevent the separation from occurring.

To demonstrate the effect of the embodiment of the present invention, a test was carried out in which a tungsten film was deposited on a substrate in a reactor furnace, and the substrate was then taken out of the reactor furnace and subjected to a heat treatment. The heat treatment was done in an atmosphere of forming gas by using a known hot-wall-type annealing furnace.

It has been found from the test that, since the substrate is once taken out of the furnace, the temperature of the substrate decreases so that the tungsten film is distorted with respect to the substrate to cause separation between them as in the case of the prior art. Even after the heat treatment, the separation was not corrected well. Namely, a percent failure examined by the thermal cycle test was improved only up to 40% by the heat treatment which was done after the temperature of the substrate decreased. The result of the test verifies the effectiveness of the present invention.

A preferable temperature range for forming tungsten films 9 according to the present invention is from 250° C. to 360° C., and an effective temperature range for the heat treatment is from 300° C. to 600° C. Most preferable temperature range for the heat treatment is from about 500° C. to about 550° C.

Another test has been carried out in which tungsten films were formed on substrates at a temperature of 320° C. to have different film thicknesses. Just after that, some of the substrates with the tungsten films were continuously subjected to a heat treatment (i) according to the present invention, and others no heat treatment (ii). The heat treatment (i) was done at 500° C. for 180 seconds. Then, all the substrates with the films were placed under an atmospheric pressure and inspected for the existence of separation. Results are as shown in Table 1.

TABLE 1

| Heat treatment | Film thickness (μm) | | |
| --- | --- | --- | --- |
| | 0.2 | 0.4 | 0.6 |
| | Separation | | |
| Yes | No | No | No |
| No | Local | Yes | Yes |

It is apparent from Table 1 that the present invention is effective to prevent the film separation from occurring even when the film thickness is large.

The reasons why the present invention is effective in preventing the film separation may be as follows:

(a) due to the heat treatment, atoms of the substrate and refractory metal films move actively to strengthen adhesive action at contact surfaces of them;

(b) due to the heat treatment, fluorine near the contact interface is removed to strengthen the adhesion; and (c) the heat treatment helps the atoms of the substrate and refractory metal films to rearrange to strengthen their adhesion.

Although a mixture of $WF_6$ gas, $H_2$ gas and $SiH_4$ gas has been used in the tungsten film growing process according to the selective chemical vapor deposition technique of the present invention, a mixture of $WF_6$ gas and Ar gas or a mixture of $WF_6$ gas and $H_2$ gas is also effective for the selective chemical vapor deposition technique of the present invention.

Not only the tungsten films but also other refractory metal films such as molybdenum (Mo) films, or refractory metal silicide films may be formed according to the selective chemical vapor deposition technique of the present invention.

Although the heat treatment has been carried out in nitrogen ($N_2$) gas in the embodiment, the heat treatment may be carried out in other inert gases such as an argon (Ar) gas, or in a hydrogen ($H_2$) gas.

As explained in the above, the method of the present invention is effective irrespective of the kinds and temperatures of atmospheric gases and the kinds of processes to be done before and after the present invention method, as long as the heat treatment is carried out before the temperatures of the substrate and refractory metal films decrease and at a temperature higher than the temperature at which the refractory metal films have been embedded in the contact holes of the substrate.

The present invention is applicable not only for the connection between the semiconductor substrate and the wiring but also for substrates made of polycrystalline silicon films, metal silicide films and electrode wiring metal films.

Figure 4:
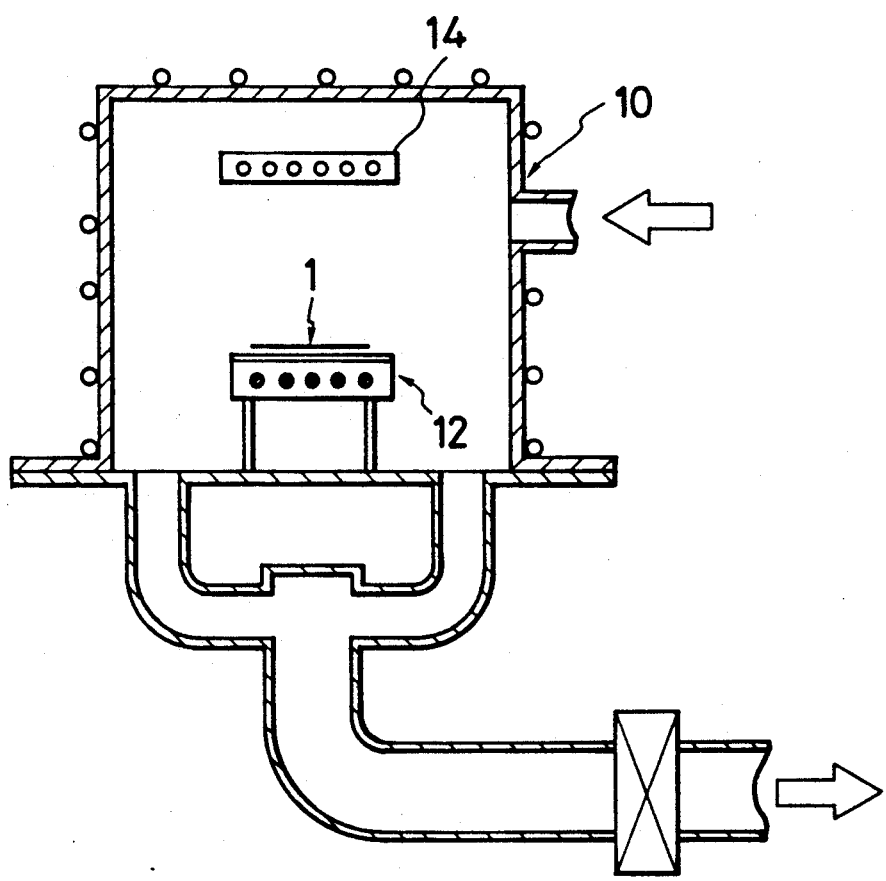
FIG. 4 is a schematic view showing the constitution of an apparatus for forming refractory metal films according to another embodiment of the present invention.

FIG. 4 is a view showing an apparatus for forming refractory metal films on a substrate according to another embodiment of the present invention.

This apparatus is effective to achieve the above-mentioned method of the present invention. The apparatus comprises a reactor furnace 10 for carrying out the chemical vapor deposition, a first heater 12 and a second heater 14.

The first heater 12 is provided for the reactor furnace 10 to heat a substrate 1 disposed in the reactor furnace 10 to a predetermined temperature (300° C. in this embodiment) to form refractory metal films on the substrate 1. The second heater 14 continuously heats the substrate 1 and the metal films to a temperature (500° C. in this embodiment) that is higher than the former temperature 300° C. before the temperatures of the substrate and films decrease below 300° C.

The heater 14 is so constituted to operate only while the first heater 12 is continuously operating, because the heat treatment at 500° C. shall be carried out after the formation of the metal films without decreasing the temperatures of the substrates and films below 300° C.

Figure 5:
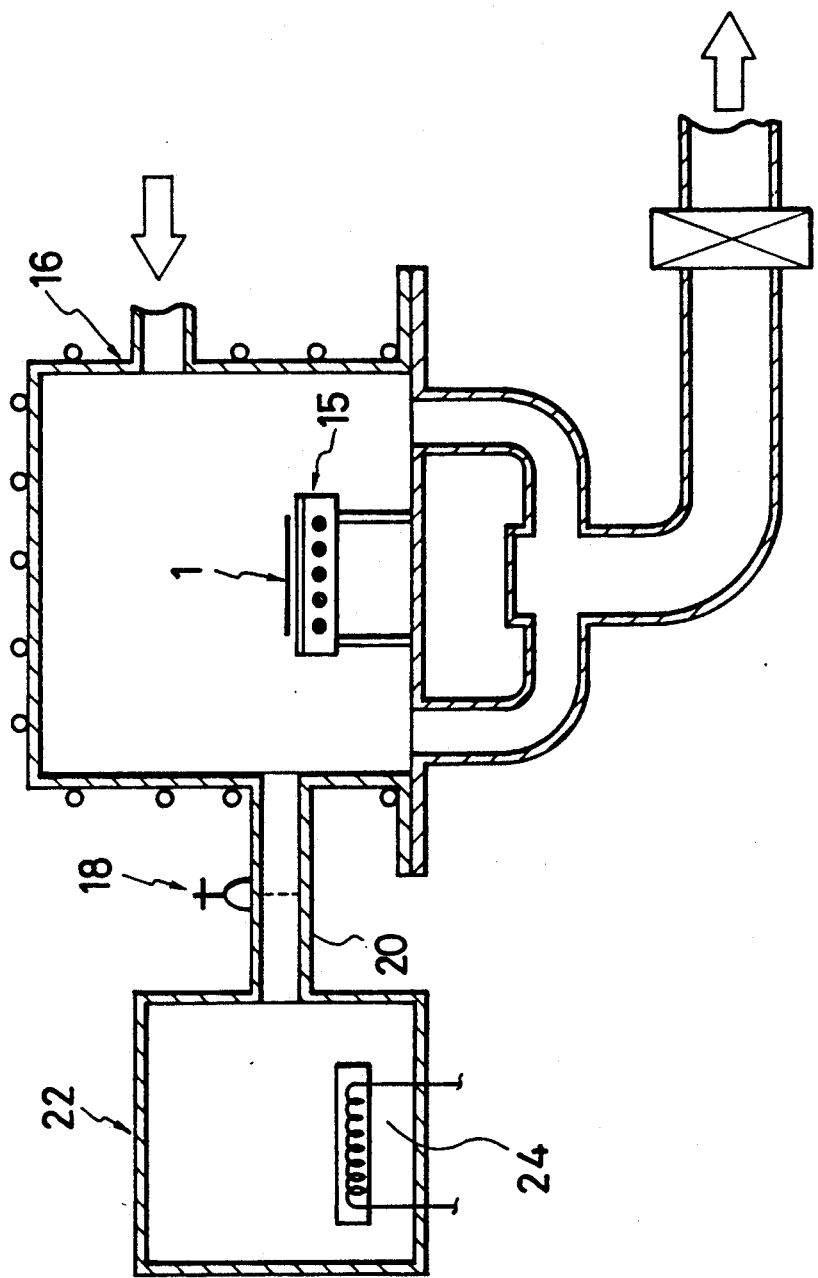
FIG. 5 is a schematic view showing a modification of the apparatus of the present invention.

The apparatus of the present invention is not limited to the above-mentioned embodiment. FIG. 5 is a view showing a modification of the apparatus. The modification comprises a reactor furnace 16 having a first heater 15, and another furnace 22 connected to the reactor furnace 16 via a duct 20 having a valve 18. A second heater 24 is provided for the furnace 22 to maintain the temperature of the furnace 22 at a predetermined value higher than the temperature value of the reactor furnace 16. By controlling the valve 18, the same effect as that of the embodiment shown in FIG. 4 will be realized.

In summary, according to the method of the present invention, refractory metal films are embedded in contact holes of a substrate, and a heat treatment is carried out on the substrate and refractory metal films at a temperature higher than a temperature of embedding the refractory metal films and without decreasing the temperature of the substrate and refractory metal films below the temperature at which the refractory metal films are embedded. As a result, adhesion of the refractory metal films with respect to the substrate is improved to prevent the films from separating from the substrate, thus improving reliability of the contacts of the substrate.

Various modifications will become possible for those skilled in the art after receiving the teachings of the present disclosure without departing from the scope thereof.

What is claimed is:

1. A method of adhering a refractory metal film to a silicon semiconductor surface, comprising the steps of:
   forming an insulating film on a silicon semiconductor substrate;
   forming a contact hole through said insulating film to expose a surface of said silicon semiconductor substrate;
   selectively depositing a refractory metal film on the exposed silicon semiconductor surface at a first temperature by selective chemical vapor deposition; and
   heating the contact surface between the deposited film and the substrate, after the completion of the depositing step, at a second temperature, higher than said first temperature, to improve the adhesion of the refractory metal film to the silicon semiconductor surface, said second temperature being between about 300° C. and 600° C., wherein the depositing and heating steps are performed in a single reaction furnace and the temperature between the depositing and heating steps does not drop below about 300° C.

2. The method as claimed in claim 1, wherein the semiconductor substrate is doped with an impurity.

3. The method as claimed in claim 1, wherein the first temperature is between about 250° and 360° C.

4. The method as claimed in claim 1, wherein the second temperature is between about 500° and 550° C.

5. The method as claimed in claim 3, wherein the refractory metal film is a tungsten film.

6. The method as claimed in claim 1, wherein the refractory metal film is one of a tungsten film and a molybdenum film.

7. The method as claimed in claim 2, wherein the first temperature is between about 250° and 360° C.

8. The method as claimed in claim 2, wherein the second temperature is between about 500° and 550° C.

9. The method as claimed in claim 2, wherein the refractory metal film is a tungsten film.

10. The method as claimed in claim 2, wherein the refractory metal film is one of a tungsten film and a molybdenum film.

11. The method as claimed in claim 4, wherein the refractory metal film has the same composition before and after the heating step.

12. The method as claimed in claim 2, wherein the refractory metal film has the same composition before and after the heating step.

13. The method as claimed in claim 1, wherein the refractory metal film has the same composition before and after the heating step.

14. A process as claimed in claim 1, wherein the refractory metal film is deposited from a gas mixture comprising $WF_6$.

15. A process as claimed in claim 2, wherein the refractory metal film is deposited from a gas mixture comprising $WF_6$.

16. A process a claimed in claim 4, wherein the refractory metal film is deposited from a gas mixture comprising $WF_6$.

17. A method of adhering a refractory metal film to a silicon semiconductor surface, comprising the steps of:
depositing a refractory metal film on a silicon semiconductor surface at a first temperature; and
heating the contact surface between the deposited film and the silicon semiconductor surface, after the completion of the depositing step, at a second temperature between 300° and 600° C. to improve the adhesion of the refractory metal film to the surface, wherein the depositing and heating steps are performed in a single reaction furnace and the temperature between the depositing and heating steps does not drop below about 300° C.

18. A method of adhering a refractory metal film to a silicon semiconductor surface, comprising the steps of:
depositing a refractory metal film on a silicon semiconductor surface at a first temperature; and
heating the contact surface between the deposited film and the silicon semiconductor surface, after the completion of the depositing step, at a second temperature between 500° and 550° C. to improve the adhesion of the refractory metal film to the surface, wherein the depositing and heating steps are performed in a single reaction furnace and the temperature does not drop below about 300° C. between the depositing and heating steps.

19. A method of adhering a refractory metal film to a silicon semiconductor surface, comprising the steps of:
depositing a refractory metal film on a silicon semiconductor surface at a first temperature; and
heating the contact surface between the deposited film and the silicon semiconductor surface, after the completion of the depositing step, at a second temperature between 300° and 600° C. to improve the adhesion of the refractory metal film to the surface, wherein the depositing and heating steps are performed in a single reaction furnace and the temperature does not drop below about 300° C. between the depositing and heating steps.

20. A method of adhering a refractory metal film to a silicon semiconductor surface, comprising the steps of:
forming an insulating film on a silicon semiconductor substrate;
forming a contact hole through said insulating film to expose a surface of said silicon semiconductor substrate;
selectively depositing a tungsten film in said contact hole to make electrical contact with the exposed silicon semiconductor surface at a first temperature by selective chemical vapor deposition with a reactive gas comprising $WF_6$; and
heating the contact surface between the deposited film and the silicon semiconductor surface, after the completion of the depositing step, at a second temperature between 300° and 600° C. to improve the direct adhesion of the tungsten film to the surface, wherein the depositing and heating steps are performed in a single reaction furnace and the temperature between the depositing and heating steps does not drop below about 300° C.

21. The method as claimed in claim 20, wherein said reactive gas further comprises $H_2$ and $SiH_4$.

22. The method as claimed in claim 20, wherein said reactive gas further comprises argon.

* * * * *